United States Patent
Jeon et al.

(10) Patent No.: US 7,256,448 B2
(45) Date of Patent: Aug. 14, 2007

(54) SPLIT GATE TYPE NONVOLATILE SEMICONDUCTOR MEMORY DEVICE, AND METHOD OF FABRICATING THE SAME

(75) Inventors: Heeseog Jeon, Hwaseong-si (KR); Seung-beom Yoon, Suwon-si (KR); Yong-tae Kim, Yongin-si (KR); Yong-suk Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 55 days.

(21) Appl. No.: 11/349,402

(22) Filed: Feb. 7, 2006

(65) Prior Publication Data
US 2006/0128098 A1    Jun. 15, 2006

Related U.S. Application Data

(62) Division of application No. 11/083,130, filed on Mar. 17, 2005, now Pat. No. 7,029,974.

(30) Foreign Application Priority Data
Mar. 18, 2004   (KR) ................................. 04-18289

(51) Int. Cl.
*H01L 29/788*    (2006.01)
(52) U.S. Cl. ...................... 257/317; 438/201; 257/321; 257/E29.3
(58) Field of Classification Search ................ 257/315, 257/317, 321; 438/201, 266, 593
See application file for complete search history.

(56) References Cited

U.S. PATENT DOCUMENTS 5,652,161 A    7/1997  Ahn ............................ 437/43
6,391,722 B1   5/2002  Koh ............................ 438/264
6,562,673 B2   5/2003  Lin ............................ 438/211
6,646,923 B2   11/2003 Kim ....................... 365/185.27
6,914,290 B2 * 7/2005  Yoo et al. ................... 257/316

FOREIGN PATENT DOCUMENTS

KR    10-2003-0088826    11/2003

* cited by examiner

*Primary Examiner*—Quoc Hoang
(74) *Attorney, Agent, or Firm*—Mills & Onello LLP

(57) ABSTRACT

A split gate type nonvolatile semiconductor memory device and a method of fabricating a split gate type nonvolatile semiconductor memory device are provided. A gate insulating layer and a floating-gate conductive layer are formed on a semiconductor substrate. A mask layer pattern is formed on the floating-gate conductive layer to define a first opening extending in a first direction. First sacrificial spacers having a predetermined width are formed on both sidewalls corresponding to the mask layer pattern. An inter-gate insulating layer is formed on the floating-gate conductive layer. The first sacrificial spacers are removed, and the floating-gate conductive layer is etched until the gate insulating layer is exposed. A tunneling insulating layer is formed on an exposed portion of the floating-gate conductive layer. A control-gate conductive layer is formed on a surface of the semiconductor substrate. Second sacrificial spacers having predetermined widths are formed on the control-gate conductive layer. A split control gate is formed in the first opening, by etching the exposed control-gate conductive layer. The remaining mask layer pattern and inter-gate insulating layer are etched until the floating-gate conductive layer is exposed. The exposed floating-gate conductive layer is etched to form a split floating gate in the first opening.

4 Claims, 12 Drawing Sheets

SPLIT GATE TYPE NONVOLATILE SEMICONDUCTOR MEMORY DEVICE, AND METHOD OF FABRICATING THE SAME

CROSS-REFERENCE OF RELATED APPLICATIONS

This application is a divisional of U.S. application Ser. No. 11/083,130, filed Mar. 17, 2005, now U.S. Pat. No. 7,029,974, which relies for priority upon Korean Patent Application No. 10-2004-0018289, filed on Mar. 18, 2004, the contents of which are herein incorporated by reference in their entirety.

BACKGROUND OF THE INVENTION

1. Field of the Invention

The present invention relates to a split gate type nonvolatile semiconductor memory device, and a method of fabricating the same, and more particularly, to a split gate type nonvolatile semiconductor memory device using a self-alignment approach to overcome misalignment of a control gate, and a method of fabricating the same.

2. Description of the Related Art

The applications for nonvolatile semiconductor memory devices have been increasing in various fields such as mobile communication systems, memory cards and the like, since it can electrically erase and store and retain data even when power is not applied. Among nonvolatile semiconductor memories, a flash memory can program in a unit of cell and erase in a unit of block or sector. The flash memory is classified into a Metal-Nitride-Oxide-Silicon (MNOS) memory using nitride, and a floating gate memory using a floating gate, depending on the type of charge storage used in the device. Typically, a floating gate type nonvolatile semiconductor memory can be classified into a stack gate type nonvolatile semiconductor memory, a split gate type nonvolatile semiconductor memory or a combination thereof.

A conventional split gate type nonvolatile semiconductor memory device has a source region formed by implanting impurity ions into an active region of a semiconductor substrate. A pair of floating gates are disposed adjacent to each other on the semiconductor substrate at both sides of the source region while sharing the source region, and a gate insulating layer is interposed between the floating gate and the substrate. An inter-gate insulating layer having a relatively high thickness is formed on a surface of the floating gate between the floating gate and a control gate. A tunneling insulating layer is formed at a sidewall of the floating gates opposite to the source region. The control gate extends toward the inter-gate insulating layer to be overlapped with the floating gate. The control gate also extends from a sidewall of the floating gate by a predetermined length toward the semiconductor substrate having the gate insulating layer. A drain region is disposed in the semiconductor substrate down of the sidewall of the control gate.

The above described split gate type memory device can be fabricated in the following method, for example. First, after a gate insulating layer, a first polysilicon layer for forming the floating gate, and a nitride layer are subsequently formed, a nitride pattern is formed using a photolithography process to expose a portion of the first polysilicon layer to be formed as the floating gate. Next, the first polysilicon layer is thermally oxidized to form the inter-gate insulating layer, and the nitride pattern is removed. After that, the first polysilicon layer, which is not oxidized, is etched using the inter-gate insulating layer as an etching mask to form the floating gate.

Next, an insulating layer for a tunneling insulating layer and a second polysilicon layer for a control gate are formed using a Chemical Vapor Deposition (CVD) method on an entire surface of the semiconductor substrate having the inter-gate insulating layer. After that, the photolithography process is used to pattern the second polysilicon layer and the insulating layer, thereby forming the control gate and the tunneling insulating layer. Next, impurity ions are implanted into the semiconductor substrate between the floating gates to form the source region, and impurity ions are implanted into the semiconductor substrate at an outer side of the control gate to form the drain region. After that, a source line and a bit line are formed to complete the split gate type nonvolatile semiconductor memory device. An example of the conventional split gate type nonvolatile semiconductor memory device is disclosed in U.S. Pat. No. 6,646,923, incorporated herein by reference.

However, in a method of fabricating the conventional split gate type nonvolatile semiconductor memory device, the photolithography process is used to form the control gate. However, the photolithography process can cause misalignment, thereby causing an overlap variation. If misalignment occurs, an effective channel length under the control gate can be different between the memory cells, and a difference in characteristics between adjacent cells, that is, an odd cell and an even cell having mirror symmetry, can result. In the effective channel length of the control gate, this variation causes a variation of a threshold voltage of the memory cell. The variation of the threshold voltage between the odd cell and the even cell causes a difference between the cells in ON current, thereby degrading the uniformity of the memory cell.

Accordingly, a technique is required to overcome a misalignment drawback in the photolithography process for forming the control gate.

SUMMARY OF THE INVENTION

The present invention provides a split gate type nonvolatile semiconductor memory device, and a method of fabricating the same, in which a floating gate and a control gate are formed in a self-alignment approach such that an effective channel length is identically provided between adjacent memory cells to overcome an on-cell difference in characteristics between an odd cell and an even cell.

Also, the present invention provides a split gate type nonvolatile semiconductor memory device, and a method of fabricating the same, in which an overlap of a floating gate and a control gate can be flexibly controlled.

According to a first aspect of the present invention, there is provided a method of fabricating a split gate type nonvolatile semiconductor memory device, the method including: forming a gate insulating layer and a floating-gate conductive layer on a semiconductor substrate; forming a mask layer pattern on the floating-gate conductive layer to define a first opening extending in a first direction; forming first sacrificial spacers having a predetermined width on both sidewalls corresponding to the mask layer pattern; forming an inter-gate insulating layer on the floating-gate conductive layer exposed between the corresponding first sacrificial spacers; removing the first sacrificial spacers; etching the floating-gate conductive layer using the mask layer pattern and the inter-gate insulating layer as an etching mask, until the gate insulating layer is exposed; forming a tunneling insulating layer on an exposed portion of the floating-gate conductive layer; forming a control-gate conductive layer on a surface of the semiconductor substrate having the tunneling insulating layer and the inter-gate insulating layer; forming second sacrificial spacers having predetermined widths on the control-gate conductive layer on both sidewalls of the mask layer pattern within the first opening; forming a split control gate in the first opening, by etching the exposed control-gate conductive layer using the second sacrificial spacer as an etching mask such that surfaces of the mask layer pattern and the inter-gate insulating layer are exposed; etching the remaining mask layer pattern and inter-gate insulating layer using the second sacrificial spacers and the split control gate as etching masks until the floating-gate conductive layer is exposed; and etching the exposed floating-gate conductive layer using the second sacrificial spacer, the control gate and the inter-gate insulating layer as the etching mask, to form a split floating gate in the first opening.

According to a second aspect of the present invention, there is provided a method of fabricating a split gate type nonvolatile semiconductor memory device, the method including: forming a gate insulating layer and a floating-gate conductive layer on a semiconductor substrate; forming a mask layer pattern on the floating-gate conductive layer to define a first opening extending in a first direction; forming first sacrificial spacers having a predetermined width on both sidewalls corresponding to the mask layer pattern; forming an inter-gate insulating layer on the floating-gate conductive layer exposed between the corresponding first sacrificial spacers; removing the first sacrificial spacers; etching the floating-gate conductive layer using the mask layer pattern and the inter-gate insulating layer as an etching mask, until the gate insulating layer is exposed; forming a tunneling insulating layer on an exposed portion of the floating-gate conductive layer; forming a control-gate conductive layer on a surface of the semiconductor substrate having the tunneling insulating layer and the inter-gate insulating layer; forming second sacrificial spacers having first widths on the control-gate conductive layer on both sidewalls of the mask layer pattern within the first opening; forming a split control gate in the first opening, by etching the exposed control-gate conductive layer using the second sacrificial spacer as an etching mask such that surfaces of the mask layer pattern and the inter-gate insulating layer are exposed; forming third sacrificial spacers having larger widths than the first widths on the control-gate on both sidewalls of the mask layer pattern within the first opening; etching the remaining mask layer pattern and inter-gate insulating layer using the third sacrificial spacers as etching masks until the floating-gate conductive layer is exposed; and etching the exposed floating-gate conductive layer using the third sacrificial spacer, the control gate and the inter-gate insulating layer as an etching mask, to form a split floating gate in the first opening.

According the first and second aspects of the present invention, the methods can further include: cutting at least a portion of the floating-gate conductive layer in a second direction orthogonal with the first direction before the mask layer pattern is formed.

Also, the mask layer pattern can be comprised of a first mask layer and a second mask layer, and the first mask layer and the inter-gate insulating layer can use oxide layers, and the second mask layer and the first sacrificial spacer can use nitride layers The tunneling insulating layer can include a thermally grown oxide layer, and the tunneling insulating layer can further include an oxide layer deposited on the thermally grown oxide layer using CVD (Chemical Vapor Deposition).

In one embodiment, the method further comprises, after the split floating gate is formed, implanting impurity ions into the semiconductor substrate between the split floating gates to form a source region.

In one embodiment, the method further comprises, after the floating gate is formed, implanting impurity ions into a surface of the semiconductor substrate to form a low doped drain region in the semiconductor substrate down of the sidewall of the control gate; forming an insulating spacer on a sidewall of the control gate; and implanting impurity ions into the semiconductor substrate down of the sidewall of the insulating spacer to form a high doped drain region. In one embodiment, the first mask layer and the inter-gate insulating are oxide layers, and the second mask layer and the first, second and third sacrificial spacers are nitride layers. The third spacer can be a nitride layer separately formed after the removal of the second spacer. The third sacrificial spacer can be a nitride layer additionally formed on the second sacrificial spacer.

According to a third aspect of the present invention, there is provided a method of fabricating a split gate type nonvolatile semiconductor memory device, the method including: forming a device isolation region array in a region of a semiconductor substrate; forming a gate insulating layer and a floating-gate conductive layer on a surface of the semiconductor substrate; cutting a portion of the floating-gate conductive layer such that floating gates between adjacent cells can be separated from one another in a word line direction; forming a mask layer pattern on the floating gate conductive layer to define a plurality of first openings extending in the word line direction; forming a first sacrificial spacer pair having equal widths from both sidewalls of each of first openings of the mask layer pattern; forming an inter-gate insulating layer on the exposed floating-gate conductive layer between the corresponding first sacrificial spacer pair; removing the first sacrificial spacer pair; etching the floating-gate conductive layer using the mask layer pattern and the inter-gate insulating layer as etching masks until the gate insulating layer is exposed; forming a tunneling insulating layer on an exposed portion of the floating-gate conductive layer; forming a control-gate conductive layer on a surface of the semiconductor substrate having the tunneling insulating layer and the inter-gate insulating layer; forming a second sacrificial spacer pair having equal widths on the control-gate conductive layer on both sidewalls of each of the first openings of the mask layer pattern; forming a split control gate pair within the first opening, by etching the exposed control-gate conductive layer to expose surfaces of the mask layer pattern and the inter-gate insulating layer using the second sacrificial spacer pair as the etching mask; etching the remaining mask layer pattern and inter-gate insulating layer using the second sacrificial spacer pair and the split control gate pair as the etching masks until the floating-gate conductive layer is exposed; and etching the exposed floating-gate conductive layer using the second sacrificial spacer pair, the control gate pair and the inter-gate insulating layer as the etching masks to form a split floating gate pair within each of the first openings.

According to a fourth aspect of the present invention, there is provided a method of fabricating a split gate type nonvolatile semiconductor memory device, the method including: forming a device isolation region array in a region of a semiconductor substrate; forming a gate insulating layer and a floating-gate conductive layer on a surface of the semiconductor substrate; cutting a portion of the floating-gate conductive layer such that floating gates between adjacent cells can be separated from one another in a word line direction; forming a mask layer pattern on the floating gate conductive layer to define a plurality of first openings extending in the word line direction; forming a first sacrificial spacer pair having equal width from both sidewalls of each of first openings of the mask layer pattern; forming an inter-gate insulating layer on the exposed floating-gate conductive layer between the corresponding first sacrificial spacer pair; removing the first sacrificial spacer pair; etching the floating-gate conductive layer using the mask layer pattern and the inter-gate insulating layer as etching masks until the gate insulating layer is exposed; forming a tunneling insulating layer on an exposed portion of the floating-gate conductive layer; forming a control-gate conductive layer on a surface of the semiconductor substrate having the tunneling insulating layer and the inter-gate insulating layer; forming a second sacrificial spacer pair having equal width on the control-gate conductive layer on both sidewalls of each of the first openings of the mask layer pattern; forming a split control gate pair within the first opening, by etching the exposed control-gate conductive layer to expose surfaces of the mask layer pattern and the inter-gate insulating layer using the second sacrificial spacer pair as the etching mask; forming a third sacrificial spacer pair having a larger width than the first width on the control gate on both sidewalls of each of the first openings of the mask layer pattern; etching the remaining mask layer pattern and inter-gate insulating layer using the third sacrificial spacer pair as the etching mask until the floating-gate conductive layer is exposed; and etching the exposed floating-gate conductive layer using the third sacrificial spacer pair, the control gate pair and the inter-gate insulating layer as the etching masks to form a split floating gate pair within each of the first openings.

According to the third and fourth aspects of the present invention, in the cutting of the portion of the floating-gate conductive layer, the floating-gate conductive layer is cut to have a stripe shape or an island shape in a bit line direction.

According to a fifth aspect of the present invention, there is provided a split gate type nonvolatile semiconductor memory device, the device including: a semiconductor substrate which has a plurality of source regions in a word line direction; a plurality of floating gate pairs formed to interpose a gate insulating layer therebetween on the semiconductor substrate, and which share the source region with an adjacent memory cell while facing with one another; inter-gate insulating layers which are formed on surfaces of the floating gate pair; tunneling insulating layers which are formed along an opposite facing sidewall of the floating gate; and a plurality of control gate pairs which have a protrusion vertically extending at a position by a predetermined distance from the sidewall of the floating gate while being in contact with surfaces of the tunneling insulating layers, and which extends to have a cover part encompassing the floating gate between the protrusion and a sidewall and an upper surface of the floating gate.

The control gate can entirely or partially overlap the floating gate, and the tunneling insulating layer vertically extends by a predetermined distance from a sidewall portion of the protrusion of the control gate.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thicknesses of layers are exaggerated for clarity. It will be understood that when a layer is referred to as being "on" another layer or substrate, it can be directly on the other layer or substrate, or intervening layers may also be present.

DETAILED DESCRIPTION OF THE INVENTION

Figure 1A:
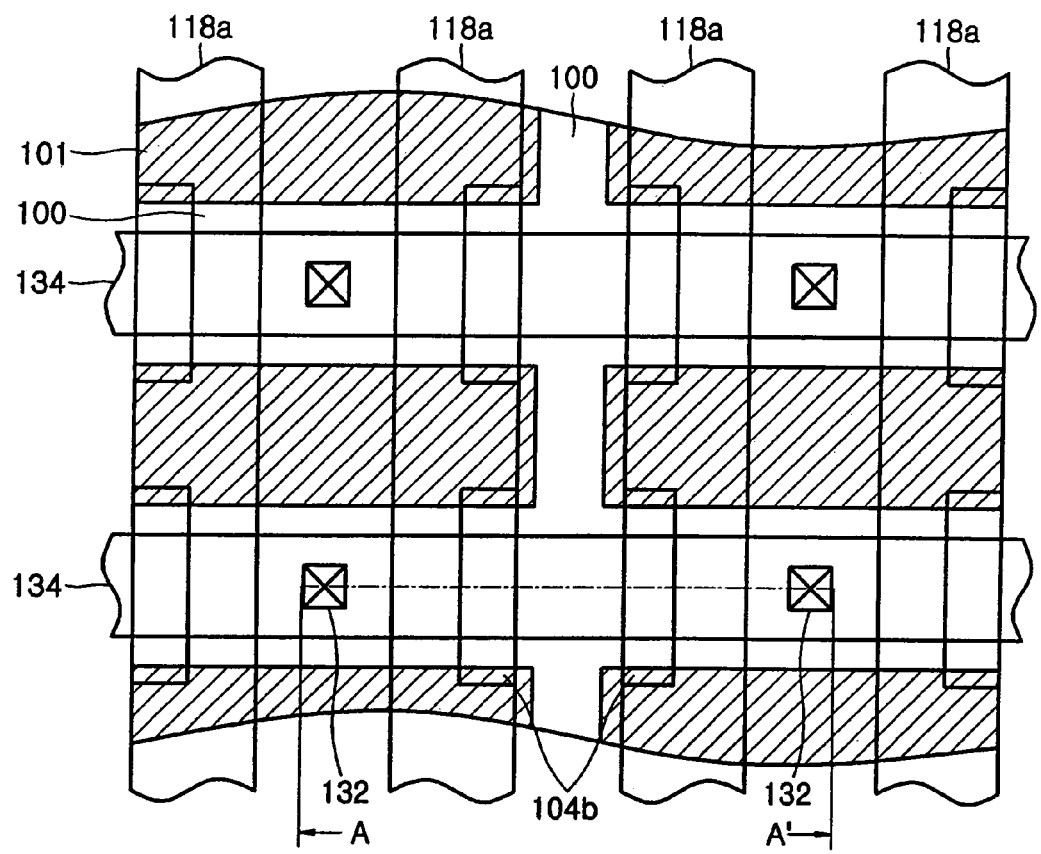
FIG. 1A is a schematic layout diagram illustrating main structural elements of a split gate type nonvolatile semiconductor memory device according to a first embodiment of the present invention.
Figure 1B:
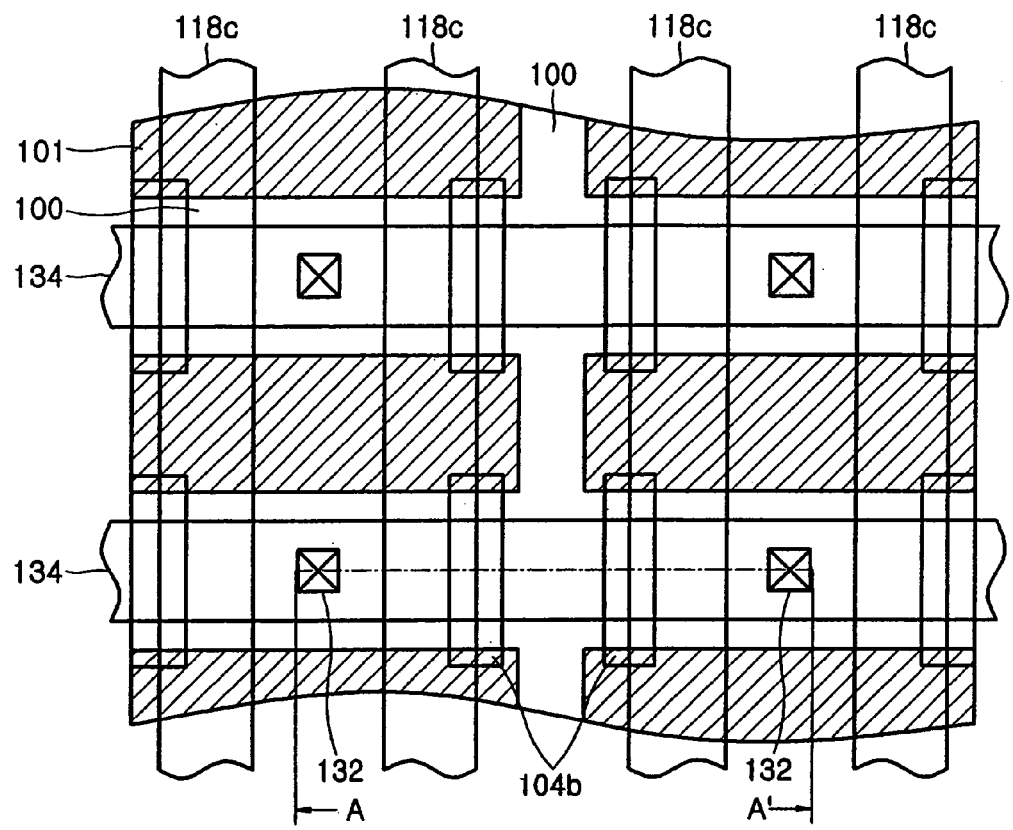
FIG. 1B is a schematic layout diagram illustrating main structural elements of a split gate type nonvolatile semiconductor memory device according to a second embodiment of the present invention.

FIGS. 1A and 1B are schematic layouts illustrating main structural elements of a split gate type nonvolatile semiconductor memory device according to embodiments of the present invention. FIG. 12 is a sectional view illustrating the split gate type nonvolatile semiconductor memory device taken along line A-A' of FIG. 1A, and FIG. 20 is a sectional view illustrating the split gate type nonvolatile semiconductor memory device taken along line A-A' of FIG. 1B. A first embodiment of the invention shown in FIGS. 1A and 2 through 12 is different from the second embodiment of the present invention shown in FIGS. 1B and 13 through 20 in that, in the first embodiment of FIGS. 1A and 2 through 12, the floating gate 104b is completely or almost completely overlapped by the control gate 118a, and, in the second embodiment of FIGS. 1B and 13 through 20, the floating gate 104b is only partially overlapped by the control gate 118c.

Referring to FIGS. 1A, 1B 12 and 20, a device isolation region 101 is partially formed using a local oxidation of silicon (LOCOS) approach or a trench isolation approach in a semiconductor substrate 100 formed of a single crystalline silicon, for example, such that a device active region is defined. At each memory cell, the floating gate 104b is independently separated and spaced apart from a floating gate 104b of an adjacent memory cell. That is, the odd cell and the even cell are repetitively disposed in a horizontal direction at the memory cell. The odd cell and the even cell are faced opposed to each other in a manner of mirror symmetry having a vertical direction as an axis. Each of the even cell (or odd cell) and an adjacent odd cell (or even cell) are disposed to share a source region 122.

A control gate 118a, 118c functioning as a word line in a direction of a word line, which is a vertical direction, is extended over the device active region and the device isolation region 101 to be overlapped with the floating gate 104b disposed at each of the memory cells. The source region 122 is disposed in the device active region of the semiconductor substrate extended in the direction of the word line between the floating gates 104b of the adjacent memory cell not having the device isolation region 101 to be shaped by both memory cells. Drain regions 124 and 128 are disposed at the device active region of the semiconductor substrate 100 exposed between the control gates 118a, 118c of the adjacent memory cell to be shared by the both memory cells. A bit line contact 132 is formed within the drain regions 124 and 128 of each of the memory cells, and is electrically connected with a bit line 134 extended over the device active region in the horizontal direction.

As shown in FIGS. 1A, 1B, 12 and 20, the split gate type flash semiconductor memory device has the floating gate 104b having an isolation structure entirely insulated from the exterior, and stores data by using a property of varying cell current depending on electron injection (writing) into the floating gate 104b and discharge (erasing) therefrom. In a write mode, if a high voltage of for example, more than 15V is applied to the source region 122 and an appropriate voltage is applied to the drain region 128, hot electrons generated in the semiconductor substrate 100 under the floating gate 104b disposed adjacently to the control gate 118a, 118c pass through a gate insulating layer 102 and are injected into the floating gate 104b. At this time, the gate insulating layer 102 functions to couple voltage applied to the source region 122 to increase an electric potential of the floating gate 104b. In an erasure mode, if a voltage of more than 15V is applied to the control gate 118a, 118c, a high electric field is applied to an edge tip of the floating gate 104b, thereby causing electrons of the floating gate 104b escape from the control gate 118, 118c. At this time, an inter-gate insulating layer 112a reduces a coupling ratio between the control gate 118a, 118c and the floating gate 104b to maintain a large electric potential between both ends. As such, the electron injection to the floating gate 104b is performed in a channel hot electron injection approach using the hot electrons in the channel region, and the electron discharge uses a Fowler-Nordheim tunneling passing through a tunneling insulating layer between the floating gate 104b and the control gate 118a, 118c.

FIRST EMBODIMENT

FIGS. 2 through 12 are sectional views illustrating a method of fabricating a split gate type nonvolatile semiconductor memory device according to a first embodiment of the present invention. The sectional views of FIGS. 2 through 12 are taken along line A-A' of FIG. 1A. The first embodiment illustrates a structure in which the control gate overlaps an entire floating gate.

Figure 2:
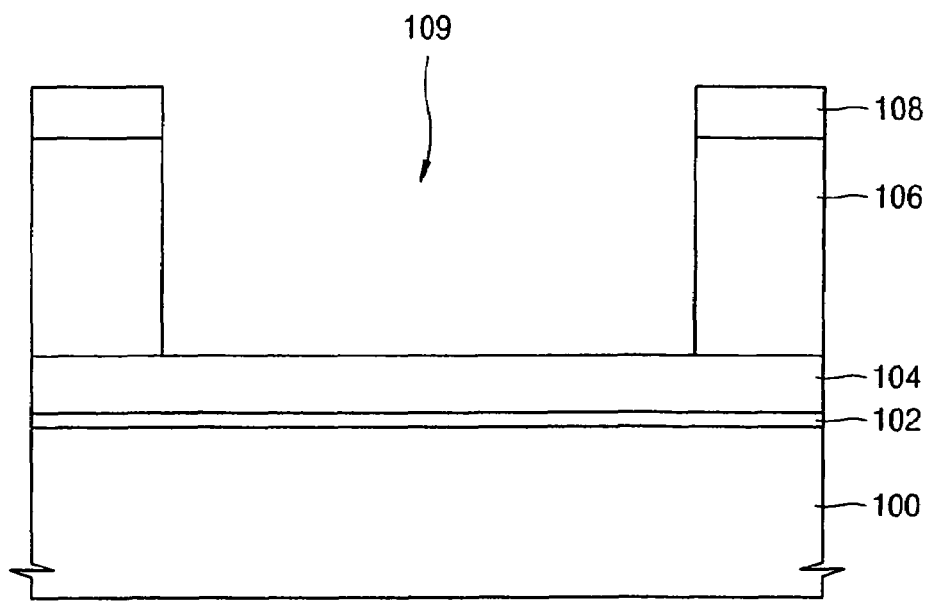
FIGS. 2 through 12 are schematic sectional views illustrating a method of fabricating a split gate type nonvolatile semiconductor memory device according to the first embodiment of the present invention illustrated in FIG. 1A, taken along line A-A' of FIG. 1A.

Referring to FIG. 2, in an example where the device active region is defined using the LOCOS approach or a trench isolation approach such as shallow trench isolation (STI), a silicon oxide layer is thermally grown as an insulating layer 102 on a P-type semiconductor substrate 100 formed of the single crystalline silicon to have a thickness of about 50 to 150 Å. A polysilicon layer is deposited as a floating-gate conductive layer 104 on the resultant structure to have a thickness of about 1000 to 2000 Å. An ion implantation or a POCl₃ deposition process is performed such that N-type impurities are doped into the polysilicon layer.

Next, as shown in FIG. 1A, a portion of the floating-gate conductive layer 104 is cut and removed using photolithography to separate the floating gate in the direction of the word line. That is, the floating-gate conductive layer 104 can be cut to have a stripe shape extended over the device isolation region 101 in the bit line direction to separate the floating gates 104b of adjacent cells in the word line direction, or can be cut to have an island shape to define a cut portion within the device isolation region 101.

A silicon oxide layer is grown as a first mask layer 106 on the partially cut polysilicon layer 104 to have a thickness of about 2000 to 4000 Å, and a silicon nitride layer is formed as a second mask layer 108 on the resultant structure to have a thickness of about 500 to 1000 Å. A photolithography process is used to form a mask layer pattern having a first opening 109 having a predetermined width for exposing a surface of the floating-gate conductive layer 104. As described in detail below, the first opening 109 defines a region at which the floating gate and the control gate are to be formed. A plurality of openings are provided to have a stripe shape in the word line direction. For example, as shown in FIGS. 1A and 12, one opening is provided every for two corresponding word lines.

Figure 3:
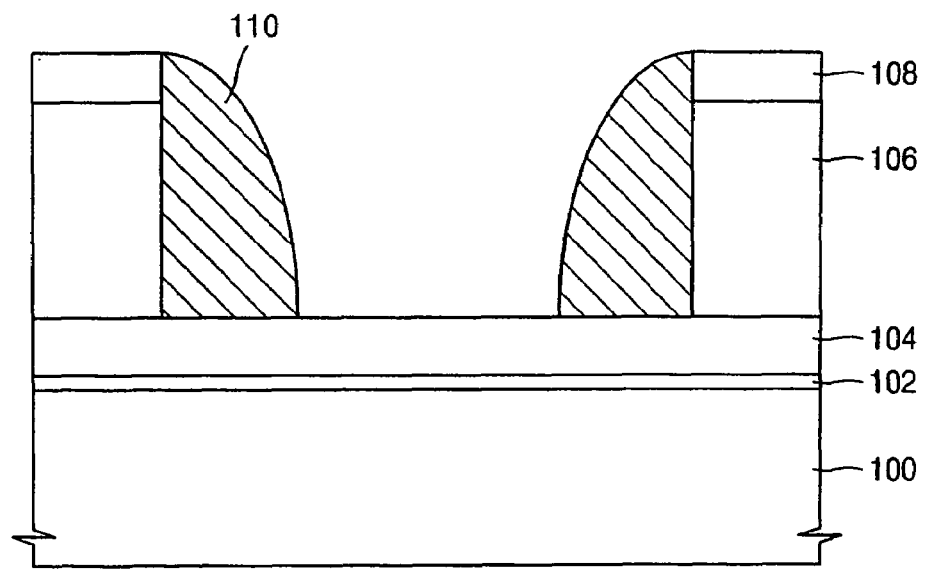

Referring to FIG. 3, a nitride layer is formed on an entire surface of the semiconductor substrate 100 having the mask layer pattern formed of the first mask layer 106 and the second mask layer 108, to have a thickness of about 2000 to 4000 Å, and then by using a dry anisotropic etching using, for example, reactive ion etching (RIE), a first sacrificial spacer 110 is formed on both sidewalls of the mask layer pattern exposed through the first opening 109, to have the same width from both sidewalls. A length of the control gate can be determined depending on a width of a bottom surface of the first sacrificial spacer 110 that is in contact with a surface of the floating-gate conductive layer 104, as described in detail below.

Figure 4:
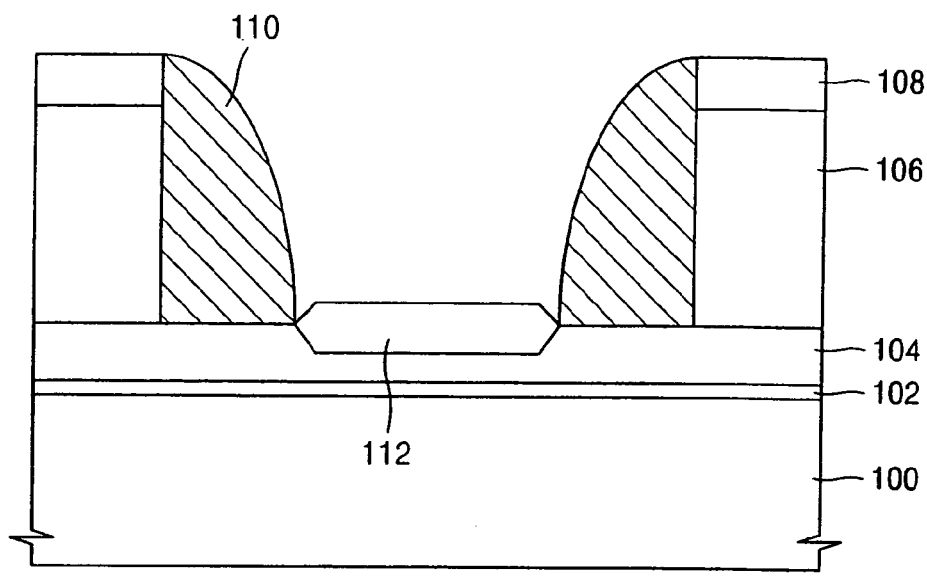

Referring to FIG. 4, a thermal oxidation process is selectively performed for the floating-gate conductive layer 104 exposed between the first sacrificial spacer 110 pair formed at both sidewalls within the first opening 109, to form an inter-gate insulating layer 112 at a thickness of about 500 to 1500 Å.

Figure 5:
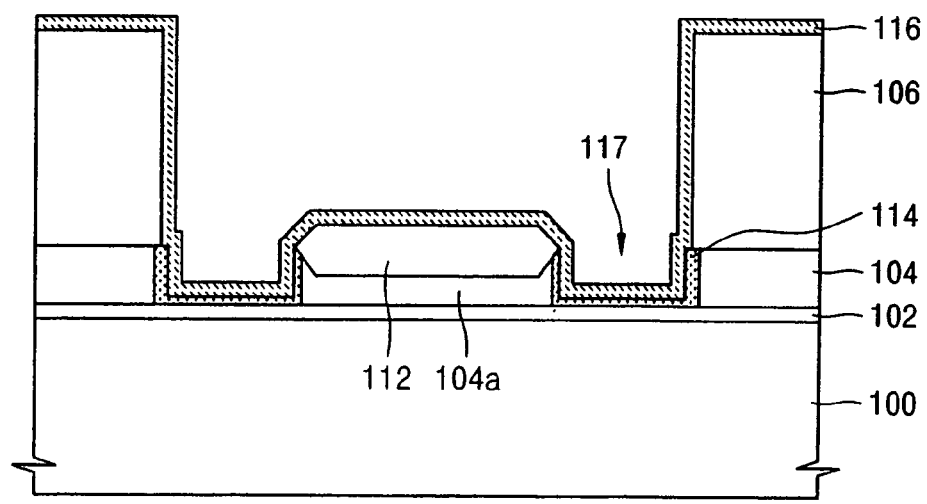

Referring to FIG. 5, the second mask layer 108 and the first sacrificial spacer 110 are selectively wet etched using phosphoric acid. The second mask layer 108 and the first sacrificial spacer 110 are, for example, formed of the nitride layer having an etching selectivity with respect to the inter-gate insulating layer 112, which is, for example, formed of the oxide layer. Next, the exposed portion of the floating-gate conductive layer 104 is anisotropically etched until the gate insulating layer 102 is exposed, using the first mask layer 106 and the inter-gate insulating layer 112 as etching masks, to form the stripe-shaped second opening 117 between the inter-gate insulating layer 112 and the first mask layer 106. Next, after the etched portion is cleaned, a tunneling insulating layer is formed. The tunneling insulating layer according to this embodiment is a dual layer comprised of a first tunneling insulating layer 114 and a second tunneling insulating layer 116, but can also be formed of one of the layers. The first tunneling insulating layer 114 is a thermal oxidation layer thinly formed on an exposed surface of the floating-gate conductive layer 104 and a surface of the gate insulating layer 102 by using a thermal oxidation process. The second tunneling insulating layer 116 is a chemical vapor deposition (CVD) oxidation layer formed on an entire surface of the substrate by using a CVD process. In this embodiment, the first tunneling insulating layer 114 is formed to have a thickness of about 30 to 100 Å, and the second tunneling layer 116 is formed to have a thickness of about 50 to 150 Å.

Figure 6:
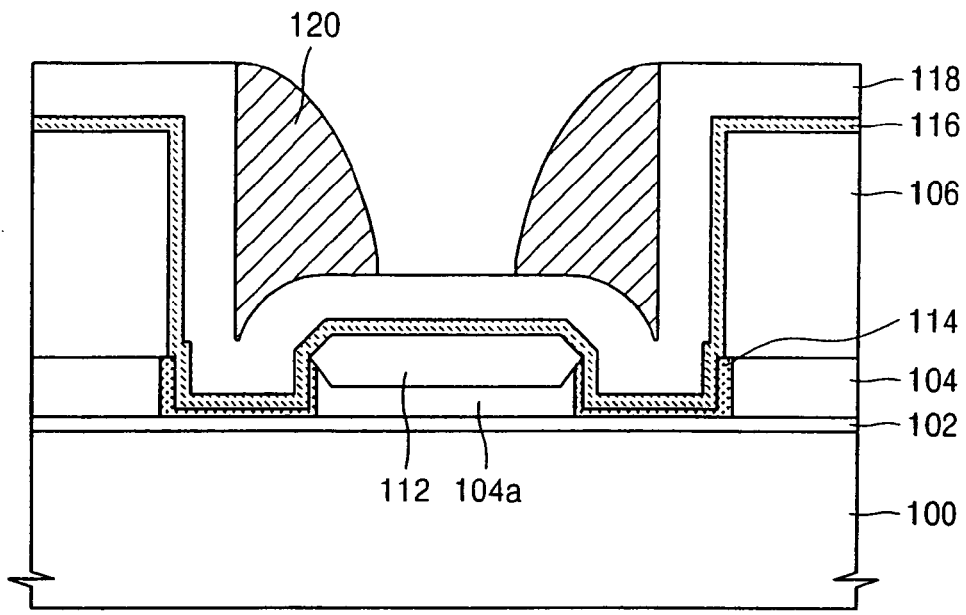

Referring to FIG. 6, a polysilicon layer is formed as a control-gate conductive layer 118 on an entire surface having the second tunneling insulating layer 116 to have a thickness of about 1000 to 3000 Å, and then, for example, a nitride layer having etching selectivity with respect to the control-gate conductive layer 118, the first mask layer 106 and the inter-gate insulating layer 112 is formed to have a thickness of about 1000 to 3000 Å. After that, anisotropic etching is performed by, for example, RIE, to form a second sacrificial spacer 120 on a sidewall of the control-gate conductive layer 118 within the first opening 109. The thickness of the control-gate conductive layer 118 and a lower width of the second sacrificial spacer 120 are important factors for determining a length of the floating gate in a subsequent process.

Figure 7:
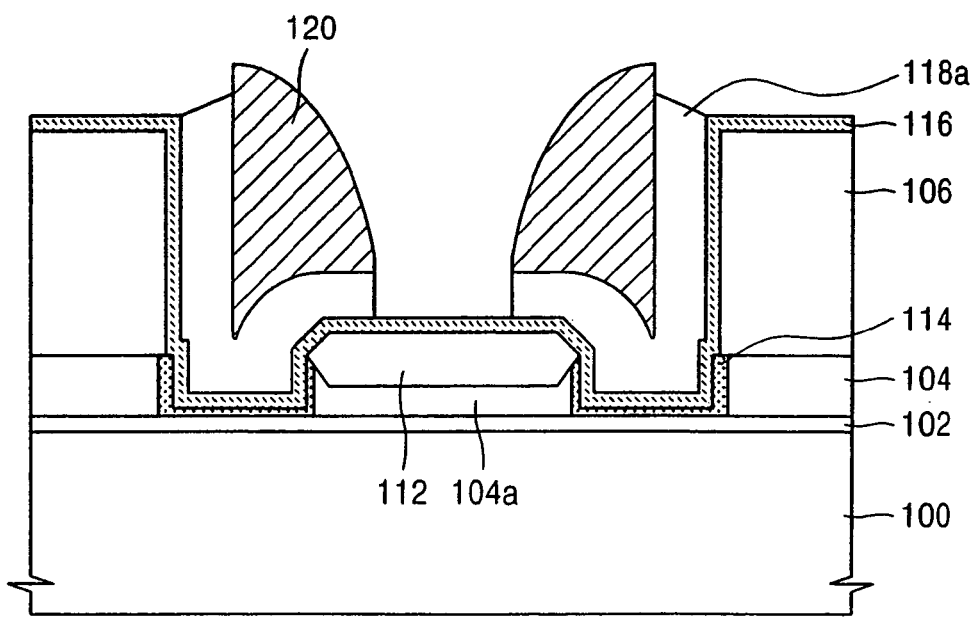

Referring to FIG. 7, the control-gate conductive layer 118 exposed using the second sacrificial spacer 120 as the etching mask is etched to expose a surface of the second tunneling insulating layer 116. The control-gate conductive layer 118 is separated and formed as a control gate 118a for every cell along the word line.

Figure 8:
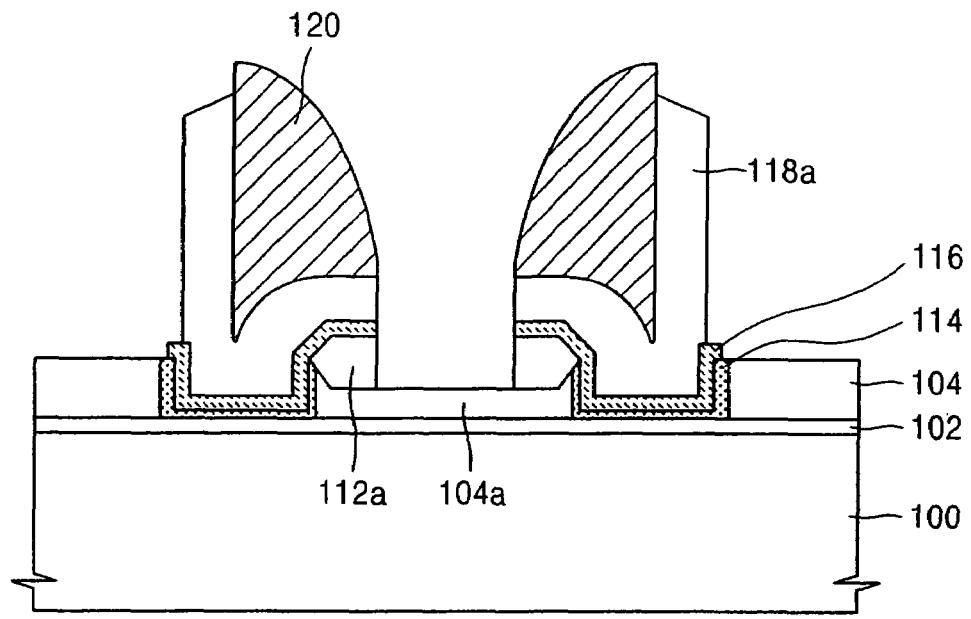

Referring to FIG. 8, the second tunneling insulating layer 116 exposed using the second sacrificial spacer 120 and the control gate 118a as the etching masks is etched. After that, the first mask layer 106 and the inter-gate insulating layer 112 are etched to expose the floating-gate conductive layer 104a. At this time, the inter-gate insulating layer 112 within the first opening is also separated to have the same size every cell.

Figure 9:
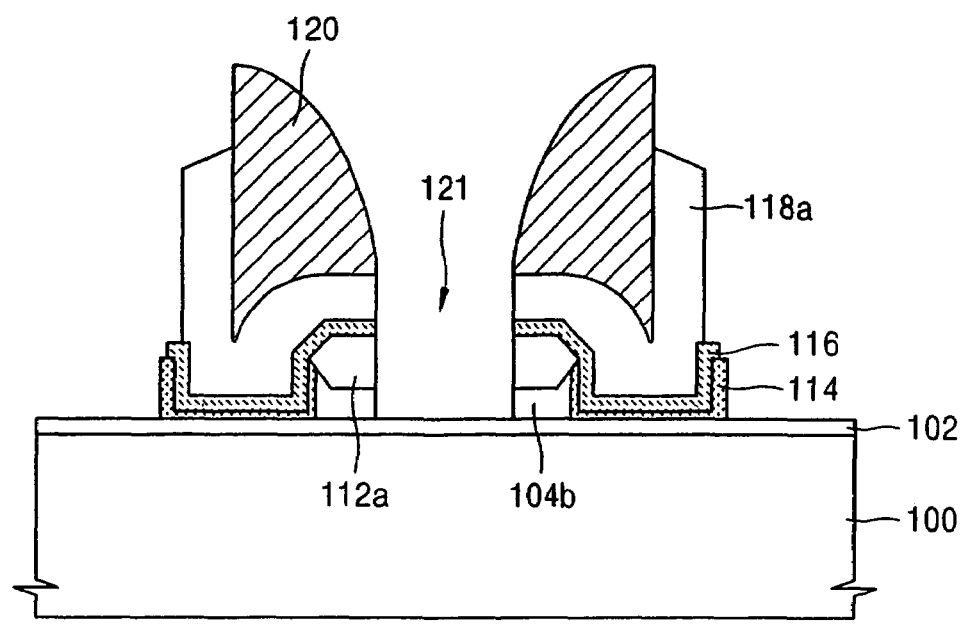

Referring to FIG. 9, the floating-gate conductive layer 104a exposed using the second sacrificial spacer 120, the control gate 118a and the split inter-gate insulating layer 112a as the etching masks is etched until the gate insulating layer 102 is exposed, to form a third opening 121. At this time, the floating-gate conductive layer 104 is formed as a split independent floating gate 104b within each cell, and the remaining floating-gate conductive layer 104 is etched at an outer side of the control gate 118a. At this time, an exposed portion of the control gate 118a can be also etched to some degree, and the control gate 118a formed to have a protrusion on the tunneling insulating layer is etched to have a decreased height. Next, the remaining second sacrificial spacer 120 is removed. The second sacrificial spacer 120 can also remain according to need.

Figure 10:
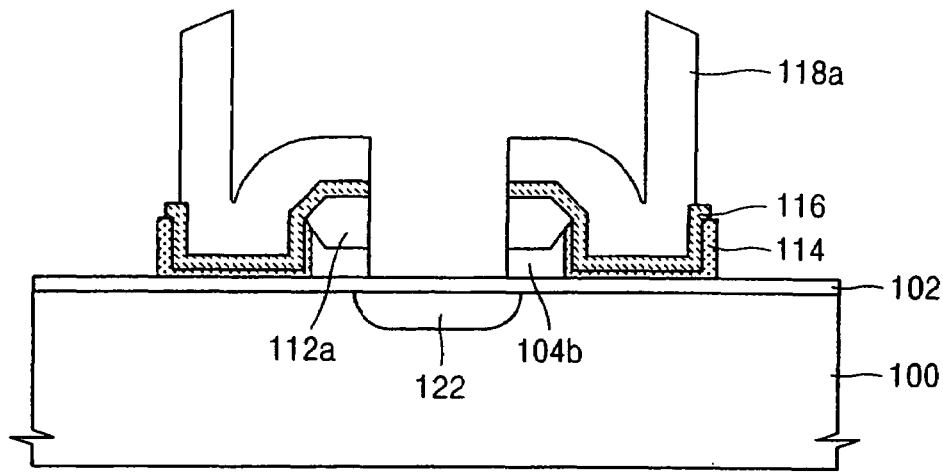

Referring to FIG. 10, the N-type impurities are implanted at a concentration of $1.0E15$ to $1.0E16$ ions/cm$^2$ to form the source region 122 in the exposed semiconductor substrate 100 between the floating gates 104b. According to need, the mask layer is used to selectively define only the source region 122 for implantation.

Figure 11:
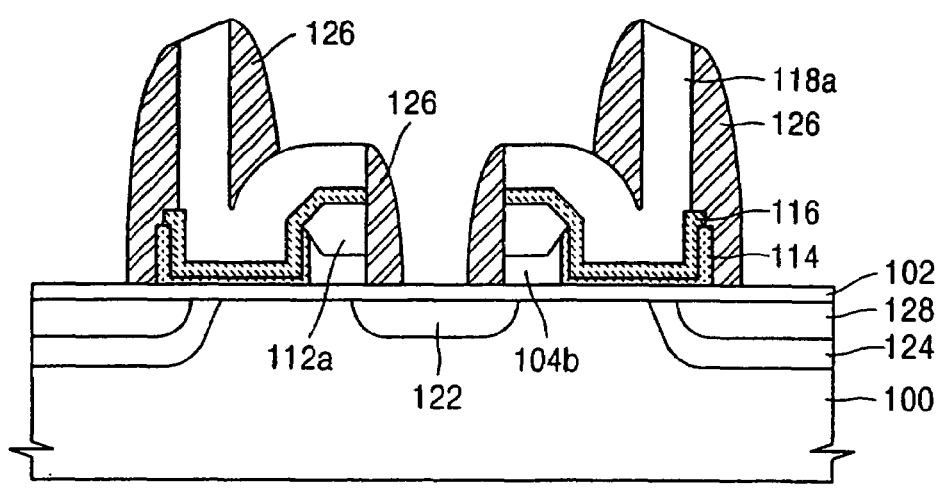
Figure 12:
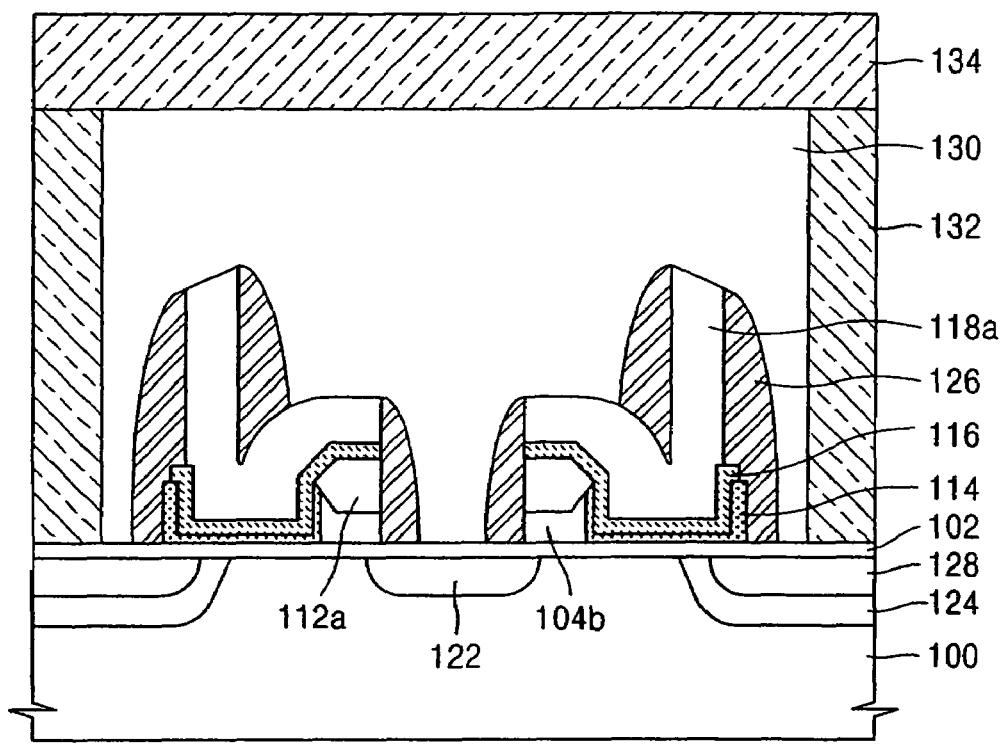

Referring to FIG. 11, after the control gate 118a or a separate mask is formed, N-type impurities of about $\sim 1.0E14$ ions/cm$^2$ are implanted to form a low doped drain region 124. Next, after an oxide layer is formed as an insulating layer to have a thickness of about 1000 to 2000 Å, anisotropic etching is performed to form an insulating spacer 126 on a sidewall of the control gate 118a. After that, N-type impurities of about $\sim 1.0E16$ ions/cm$^2$ are implanted to form a high doped drain region 128.

Referring to FIG. 12, after an interlayer insulating layer 130 is formed over the structure, a planarization process such as CMP is performed. Next, after a bit line contact 132 is formed using a tungsten plug and the like through a metal contact forming process, a bit line 134 is formed through a metal process. A Ti/TiN barrier metal layer can be formed for the bit line contact. At this time, a CVD-tungsten (W) plug can be used and aluminum can be used for the bit line.

SECOND EMBODIMENT

FIGS. 13 through 20 are sectional views illustrating a method of fabricating a split gate type nonvolatile semiconductor memory device according to a second embodiment of the present invention, and are views taken along line A-A' of FIG. 1B. Since the second embodiment includes the same fabrication process steps as FIGS. 2 to 5 described in connection with the first embodiment, the detailed description thereof is not repeated. The second embodiment illustrates a structure in which a control gate partially overlaps a floating gate.

Figure 13:
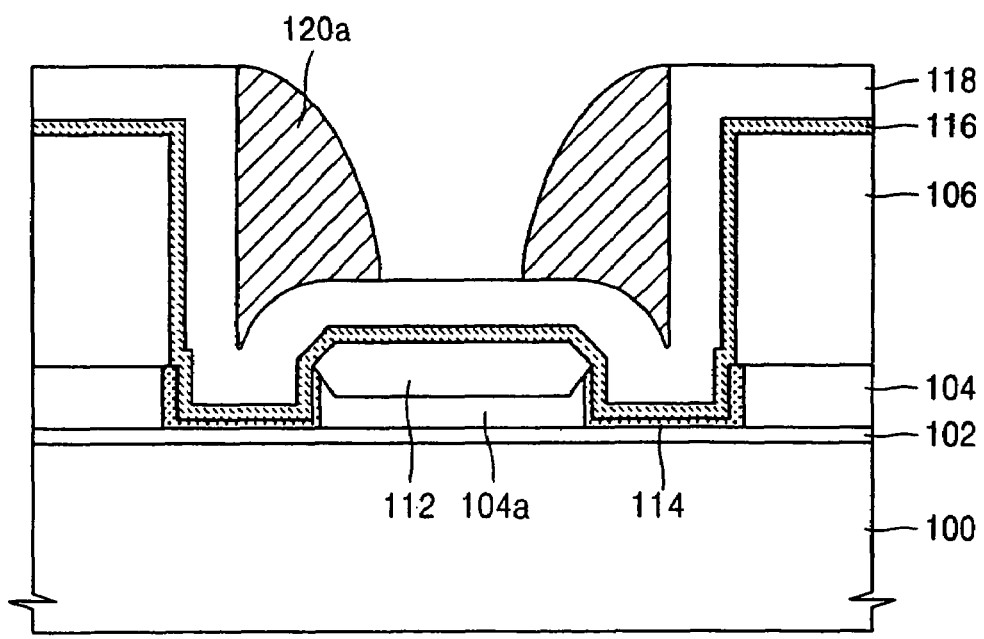
FIGS. 13 through 20 are schematic sectional views illustrating a method of fabricating a split gate type nonvolatile semiconductor memory device according to the second embodiment of the present invention illustrated in FIG. 1B, taken along line A-A' of FIG. 1B.

Referring to FIG. 13, a polysilicon layer is formed as a control-gate conductive layer 118 on an entire surface of a second tunneling insulating layer 116. After that, for example, a nitride layer having an etching selectivity with respect to a control-gate conductive layer 118, a first mask layer 106 and an inter-gate insulating layer 112 are formed on the resultant structure to have a lower thickness than that of the first embodiment. Anisotropic etching such as reactive ion etching (RIE) is performed to form a third sacrificial spacer 120a on a sidewall of the control-gate conductive layer 118 within a first opening 109. A size of a lower width of the third sacrificial spacer 120a is a factor for determining a length of an overlap with the floating gate in a subsequent process.

Figure 14:
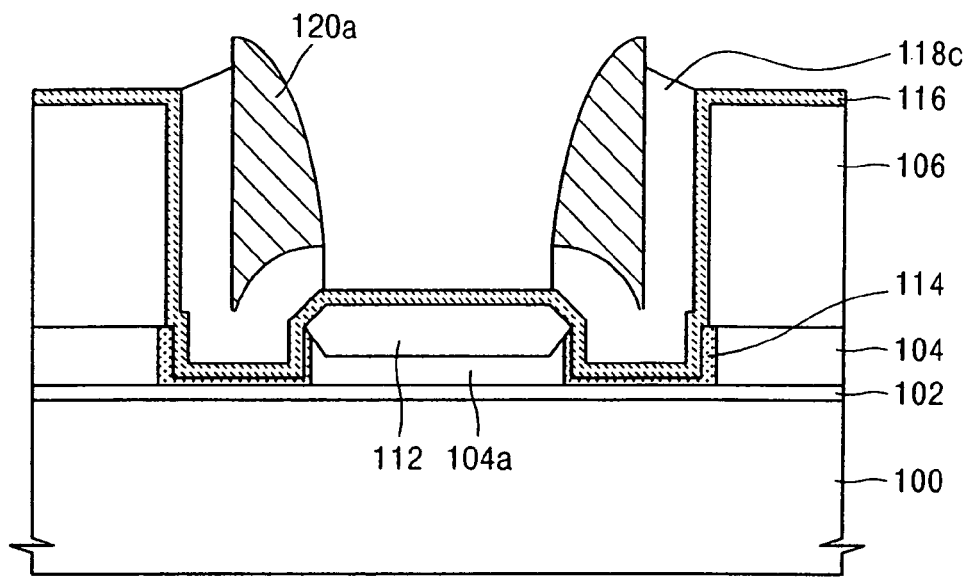

Referring to FIG. 14, the control-gate conductive layer 118 exposed using the third sacrificial spacer 120a as an etching mask is etched to expose a surface of the second tunneling insulating layer 116. The control-gate conductive layer 118 is separated every cell along a word line to be formed as the control gate 118c.

Figure 15:
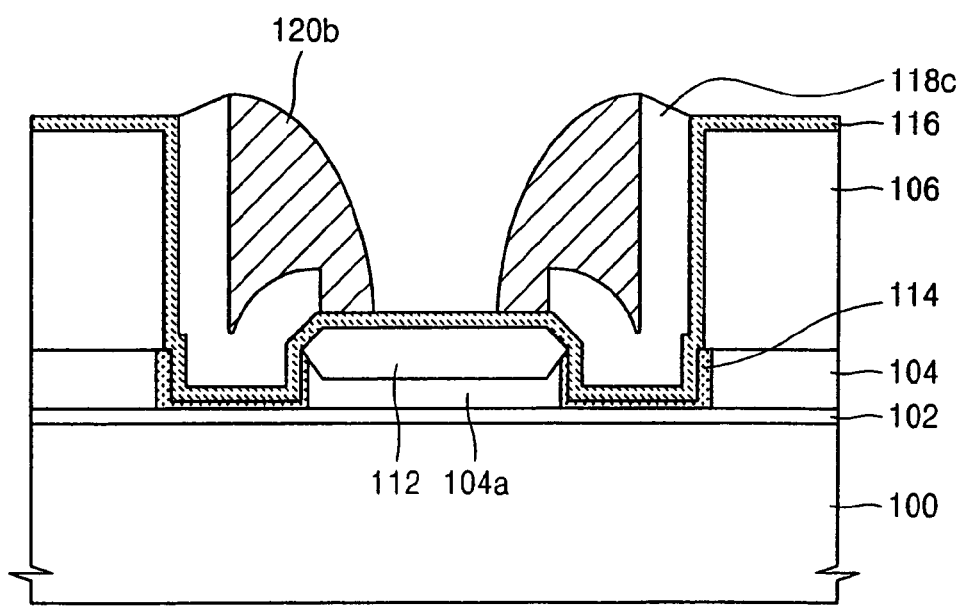

Referring to FIG. 15, after the third sacrificial spacer 120a is removed, a nitride layer, for example, is formed over an entire surface of the semiconductor substrate to have a heavier thickness than the third sacrificial spacer 120a. After that, a fourth sacrificial spacer 120b is formed on an inner sidewall of the control gate 118c by using the anisotropy etching. The lower width of a fourth sacrificial spacer 120b is larger than that of the third sacrificial spacer 120a. A size of the lower width of the fourth sacrificial spacer 120b is a factor for determining a length of the floating gate in a subsequent process.

Figure 16:
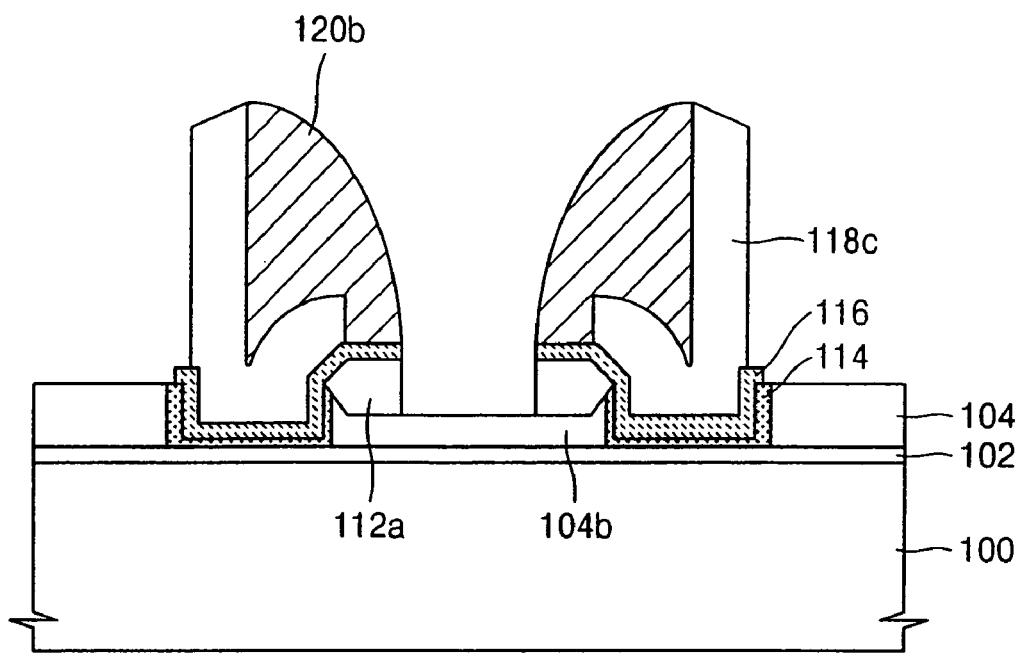

Referring to FIG. 16, the second tunneling insulating layer 116 exposed using the fourth sacrificial spacer 120b and the control gate 118c as the etching masks is etched. Next, the first mask layer 106 and the inter-gate insulating layer 112 are etched to expose the floating-gate conductive layer 104. At this time, the inter-gate insulating layer 112a disposed within the first opening is respectively separated to have the same size at each of the cells.

Figure 17:
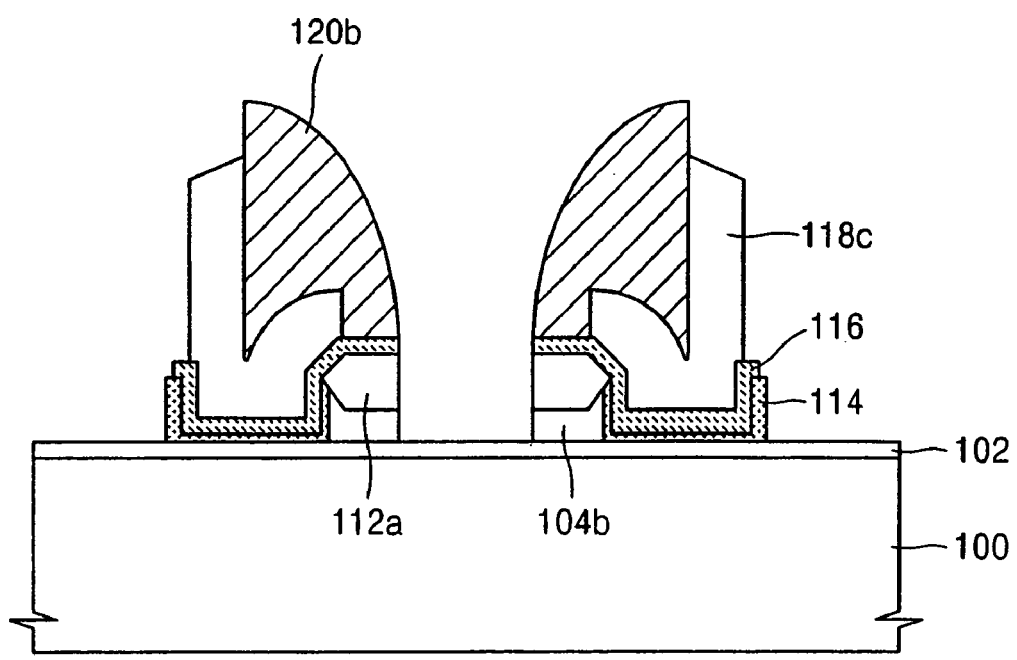

Referring to FIG. 17, the floating-gate conductive layer 104 exposed using the fourth sacrificial spacer 120b, the control gate 118c and the split inter-gate insulating layer 112a as the etching masks is etched until the gate insulating layer 102 is exposed. At this time, the floating-gate conductive layer 104 is formed as a split independent floating gate 104b in each of the cells, and the floating-gate conductive layer 104 remaining at an outer side of the control gate 118c is etched. At this time, an exposed portion of the control gate 118c can be also etched to some degree, and specifically, the control gate 118c protruded toward the tunneling insulating layer is etched to have a decreased height.

Figure 18:
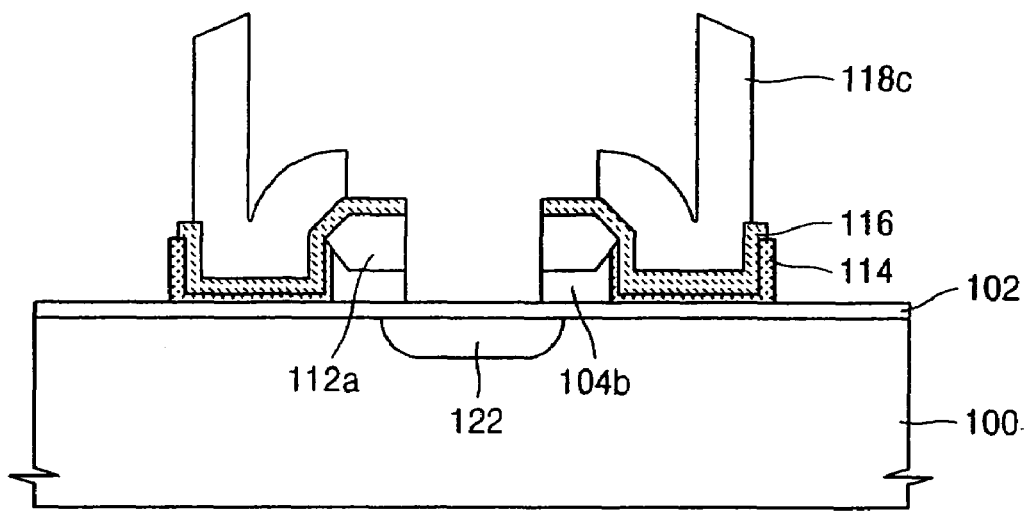

Referring to FIG. 18, N-type impurities of about $1.0E15$ to $1.0E16$ ions/cm$^2$ are implanted to form a source region 122 in the exposed semiconductor substrate 100 between the floating gates 104b. According to need, the mask layer can be also used to selectively define only the source region 122 for implantation. Next, the remaining fourth sacrificial spacer 120*b* is removed. The fourth sacrificial spacer 120*b* can also remain according to need.

Figure 19:
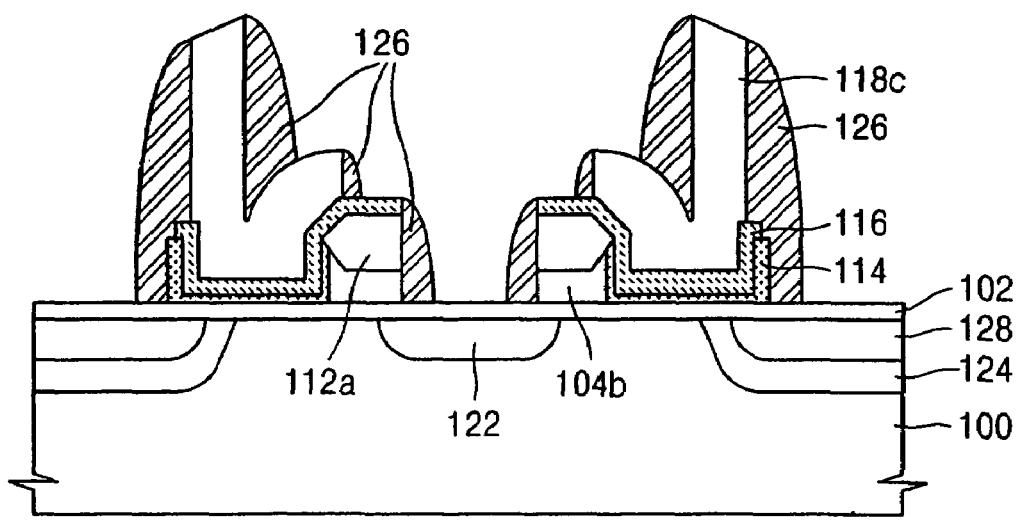
Figure 20:
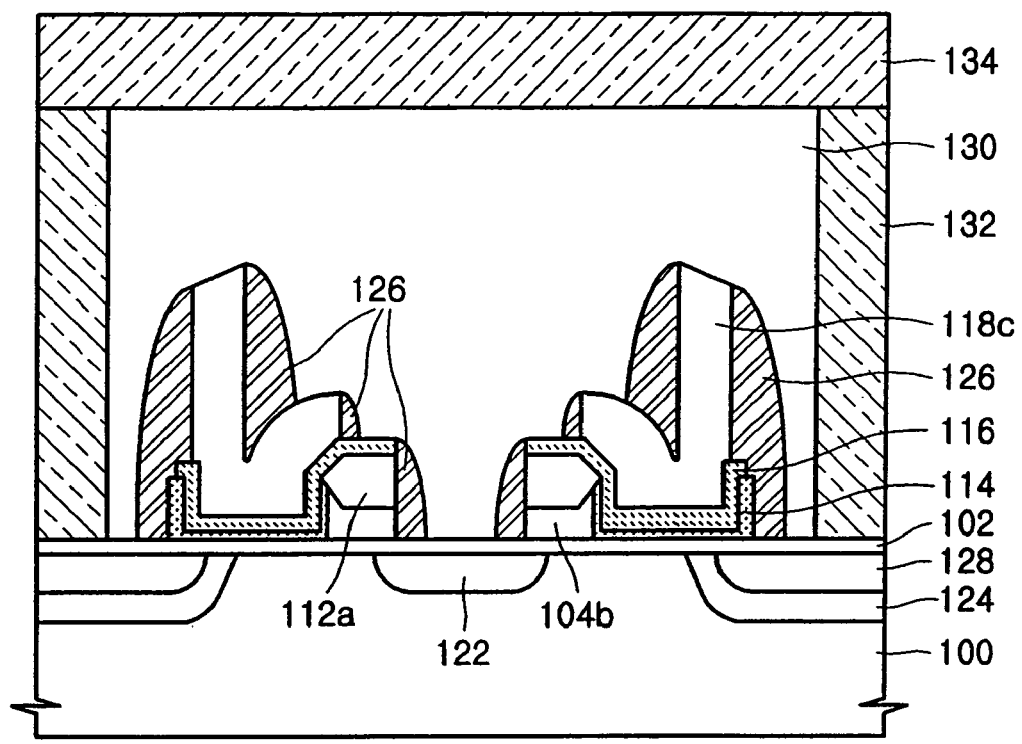

Referring to FIG. 19, after the control gate 118*c* or a separate mask is formed, N-type impurities of about ~1.0E14 ions/cm² are implanted to form a low doped drain region 124. After that, after an oxide layer is formed as the insulating layer to have a thickness of about 1000 to 2000 Å, anisotropic etching is performed to form an insulating spacer 126 on a sidewall of the control gate 118*c*. Next, N-type impurities of about ~1.0E16 ions/cm² are implanted to form a high doped drain region 128.

Referring to FIG. 20, after an interlayer insulating layer 130 is thickly formed over the structure, the planarization process such as CMP or the like is performed. After the bit line contact 132 is formed using a tungsten plug in the metal contact forming process, the bit line is formed in the metal process. A barrier metal layer of Ti/TiN can be formed for the bit line contact 132. At this time, the CVD-tungsten (W) plug can be used and aluminium can be used for the bit line.

As described above, the present invention has an advantage in that since the control gate and the floating gate are formed in a self-alignment approach, without depending on a photolithography process causing misalignment, the on current difference between the even cell and the odd cell can be overcome.

The present invention has an advantage in that size of the floating gate can be freely controlled without depending on the photolithography process, and the size of the floating gate can be regularly maintained in the even cell and the odd cell of the memory cell.

The present invention has an advantage in that the size of the control gate and the length of the channel region formed below the control gate can be freely controlled, and the size and the length can be regularly maintained in the even cell and the odd cell of the memory cell.

Further, the present invention has an advantage in that an overlap size of the control gate and the floating gate can be freely controlled.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A split gate type nonvolatile semiconductor memory device, the device comprising:
    a semiconductor substrate which has a plurality of source regions in a word line direction;
    a plurality of floating gate pairs formed to interpose a gate insulating layer therebetween on the semiconductor substrate, and which share the source region with an adjacent memory cell while facing with one another;
    inter-gate insulating layers which are formed on surfaces of the floating gate pair;
    tunneling insulating layers which are formed along an opposite facing sidewall of the floating gate; and
    a plurality of control gate pairs which have a protrusion vertically extending at a position by a predetermined distance from the sidewall of the floating gate while being in contact with surfaces of the tunneling insulating layers, and which extends to have a cover part encompassing the floating gate between the protrusion and a sidewall and an upper surface of the floating gate.

2. The device of claim 1, wherein the control gate entirely overlaps the floating gate.

3. The device of claim 1, wherein the control gate partially overlaps the floating gate.

4. The device of claim 1, wherein the tunneling insulating layer vertically extends by a predetermined distance from a sidewall portion of the protrusion of the control gate.

* * * * *